United States Patent
Gao et al.

(10) Patent No.: US 10,014,280 B2
(45) Date of Patent: *Jul. 3, 2018

(54) THREE DIMENSIONAL FULLY MOLDED POWER ELECTRONICS MODULE HAVING A PLURALITY OF SPACERS FOR HIGH POWER APPLICATIONS

(71) Applicant: Hong Kong Applied Science and Technology Research Institute Co. Ltd., Hong Kong (CN)

(72) Inventors: Ziyang Gao, Hong Kong (CN); Xunqing Shi, Hong Kong (CN); Shi Wo Chow, Hong Kong (CN)

(73) Assignee: HONG KONG APPLIED SCIENCE AND TECHNOLOGY RESEARCH INSTITUTE CO. LTD., Hong Kong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/619,532

(22) Filed: Jun. 11, 2017

(65) Prior Publication Data

US 2017/0287875 A1   Oct. 5, 2017

Related U.S. Application Data

(63) Continuation-in-part of application No. 15/084,442, filed on Mar. 29, 2016, now Pat. No. 9,704,819.

(51) Int. Cl.
*H01L 23/34* (2006.01)
*H05K 7/10* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ..... H01L 24/14; H01L 22/20; H01L 23/3107; H01L 24/17; H01L 25/0657; H01L 25/50;
(Continued)

(56) References Cited

U.S. PATENT DOCUMENTS 9,532,448 B1   12/2016   Robert
9,704,819 B1 *   7/2017   Gao et al. ............... H01L 24/14
                                                        257/724
(Continued)

FOREIGN PATENT DOCUMENTS

EP         2887392 A3    10/2016
JP      2003283138 A    10/2003

*Primary Examiner* — Alonzo Chambliss
(74) *Attorney, Agent, or Firm* — Eagle IP Limited; Jacqueline C. Lui

(57) ABSTRACT

A power electronic package includes a first substrate, a second substrate oppositely disposed from the first substrate, one or more chips disposed between the substrates, and at least three spacers. The spacers control a height variation of the power electronic package and protect the chips and other electronics from experiencing excessive stress. The height of the spacers is determined based on a height of the chips, on a height of solder blocks that connect the chips to the top substrate, and on a height of solder blocks that connect the chips to the bottom substrate.

20 Claims, 8 Drawing Sheets

(51) Int. Cl.
  *H01L 21/00* (2006.01)
  *H01L 25/065* (2006.01)
  *H01L 21/56* (2006.01)
  *H01L 21/48* (2006.01)
  *H01L 23/31* (2006.01)
  *H01L 23/498* (2006.01)
  *H01L 25/00* (2006.01)
  *H01L 23/00* (2006.01)
  *H01L 25/10* (2006.01)

(52) U.S. Cl.
  CPC ........ *H01L 21/4857* (2013.01); *H01L 21/565* (2013.01); *H01L 23/3107* (2013.01); *H01L 23/3114* (2013.01); *H01L 23/49811* (2013.01); *H01L 23/49822* (2013.01); *H01L 24/17* (2013.01); *H01L 24/20* (2013.01); *H01L 25/105* (2013.01); *H01L 25/50* (2013.01); *H01L 2225/06548* (2013.01); *H01L 2225/06582* (2013.01); *H01L 2225/06589* (2013.01)

(58) Field of Classification Search
  CPC ... H01L 24/20; H01L 25/105; H01L 21/4853; H01L 21/4857; H01L 21/486; H01L 21/565; H01L 23/3114; H01L 23/49811; H01L 23/49822
  See application file for complete search history.

(56) References Cited

U.S. PATENT DOCUMENTS

| | | |
|---|---|---|
| 2005/0224959 A1 | 10/2005 | Kwon et al. |
| 2009/0108429 A1 | 4/2009 | Tsao et al. |
| 2016/0352247 A1 | 12/2016 | Li et al. |
| 2017/0111560 A1 | 4/2017 | Chen et al. |

* cited by examiner

THREE DIMENSIONAL FULLY MOLDED POWER ELECTRONICS MODULE HAVING A PLURALITY OF SPACERS FOR HIGH POWER APPLICATIONS

FIELD OF THE INVENTION

The present invention relates to a power electronic package or a fully molded power electronic module.

BACKGROUND

Power semiconductor chips are used in many high power applications, such as hybrid electric vehicles and other transportation and energy systems. Power semiconductor chips such as metal-oxide semiconductor field-effect transistors (MOSFETs), insulated gate bipolar transistors (IGBTs), and diodes produce large amounts of heat. Consequently, when these semiconductor chips are built into packages, it is desired to dissipate the heat generated by these chips quickly and efficiently. The package for such power semiconductor chips is required to meet stringent performance criteria, such as providing high and reliable power over a long service life. Further, the power electronic packages serve to provide electrical interconnections, thermal dissipation, and mechanical support for the chips and other components housed inside.

In view of the demand for high power packaging, improvements in reliability and thermal performance are desired.

SUMMARY OF THE INVENTION

Figure 1:
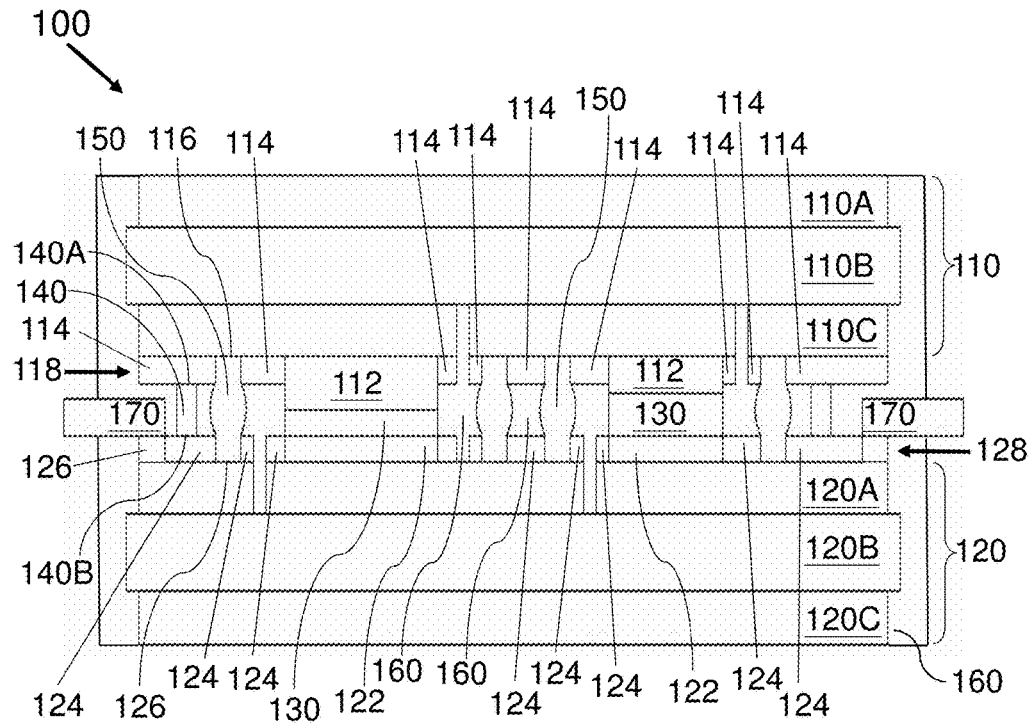
FIG. 1 shows a side view of a power electronic package in accordance with an example embodiment.

One example embodiment is a power electronic package that includes a first substrate, a second substrate oppositely disposed from the first substrate, one or more chips disposed between the substrates, and at least three spacers. The spacers control a height variation of the power electronic package and protect the chips and other electronics from experiencing excessive stress. The height of the spacers is determined based on a height of the chips, on a height of solder blocks that connect the chips to the top substrate, and on a height of solder blocks that connect the chips to the bottom substrate.

Other example embodiments are discussed herein.

DETAILED DESCRIPTION

Example embodiments relate to apparatus and methods that provide a power electronic package that includes one or more chips housed in a power electronic package or module that dissipates heat.

An example embodiment includes a power electronic package with a top substrate and a bottom substrate oppositely disposed from the top substrate. The power electronic package serves to provide electrical interconnections, thermal dissipation, and mechanical support for a plurality of high power chips sandwiched between the top and bottom substrates. The power electronic package includes spacers each having a first end that contacts the top substrate and a second end that contacts the bottom substrate. The height of the spacers is determined based on a height of the chips, on a height of solder blocks that bond the chips to the top substrate, and on a height of solder blocks that bond the chips to the bottom substrate.

The spacers are disposed between the top and bottom substrates and provide a mechanism to control a height of the power electronic package according to the specific chips provided in each package. The height of the spacers is tailored or designed according to the height of the chips, amount of solder being used, and other criteria discussed herein. A height variation of the power electronic package is thus controlled by the spacers.

In one example embodiment, a plurality of solder blocks are disposed between a top surface of the chips and the top substrate, and a plurality of solder bases are disposed between a bottom surface of the chips and the bottom substrate. The solder blocks and solder bases provide electrical paths for the chips to connect with the top substrate and the bottom substrate.

In one example embodiment, a height of the spacers is determined based on thermal properties of the substrates and the chips sandwiched in between such that heat generated by the high power chips is dissipated efficiently. A height variation of the power electronic package is precisely controlled by the spacers to be less than 0.1 mm in order to reduce mechanical stress and the collapse rate of the solder blocks.

In one example embodiment, the spacers are spaced around a perimeter of the power electronic package or adjacent one or more corners of the power electronic package in order to divert the load away from the chips and solder blocks and reduce mechanical stress on electrical components in the power electronic package.

FIG. 1 shows a side view of a power electronic package or power electronic module 100. The power electronic package 100 includes a plurality of dies or chips 130 positioned or sandwiched between a top or first direct bonded copper (DBC) substrate 110 and a bottom or second DBC substrate 120.

As one example, the top DBC substrate comprises a ceramic base 110B and two copper layers 110A and 110C that are bonded onto top and bottom sides of the ceramic base 110B. The top DBC substrate 110 has a patterned inner surface 118 that includes a first passivation region or electrically non-conductive region 114 and a first conductive region 116.

The bottom DBC substrate 120 has a patterned inner surface 128 that includes a second passivation region or electrically non-conductive region 124 and a second conductive region 126. The passivation regions are formed on inner surfaces of bottom and top DBC substrates by, for an example, oxidizing the copper, such that the non-oxidized region is defined as electrical connection paths and solderable areas on the inner surfaces 118 and 128.

A first plurality of solder blocks or solder balls 112 are disposed between a top surface of the chips 130 and the first conductive region 116 of the top DBC substrate 110, and a second plurality of solder blocks or solder bases 122 are disposed between a bottom surface of the chips 130 and the second conductive region 126 of the bottom DBC substrate 120.

One or more spacers 140 are disposed between the top DBC substrate 110 and the second DBC substrate 120. Each spacer has a first end or terminal 140A and a second end of terminal 140B. The first end 140A contacts or abuts the first passivation region 114 of the top DBC substrate 110, and the second end 140B contacts or abuts the second passivation region 124 of the bottom DBC substrate 120.

In an example embodiment, a height of the spacer 140 is equal to a sum of a height of the chips 130, a height of the first plurality of solder blocks 112, and a height of the second plurality of solder blocks 122. The height variation of the power electronic package is precisely controlled to be less than 0.1 mm. The small variation of height reduces mechanical stress on the chips and the solder blocks introduced in the moldering process and reduce the collapse rate of the solder blocks.

As shown in FIG. 1, the power electronic package 100 further includes a third plurality of solder blocks or solder balls 150 that contact the first conductive region 116 of the top DBC substrate 110 and contact the second conductive region 126 of the bottom DBC substrate 120 to electrically connect the top DBC substrate with the bottom DBC substrate. In one example embodiment, a height of the solder balls is 60%-80% of the width of the solder balls.

As shown in FIG. 1, the power electronic package 100 also includes a molding compound or encapsulant 160 that fills the gaps between the top DBC substrate and the bottom DBC substrate by a fully molding process or a transfer molding process. For example, a silicone gel or epoxy mold compound (EMC) is introduced into open cavities inside the package to provide a locking mechanism and improve the reliability of the package. As one example, the outer surfaces of the substrates 110 and 120 or portions thereof are not covered by the molding compound in order to efficiently dissipate heat to ambient air.

As shown in FIG. 1, the power electronic package 100 also includes lead frames 170 that are soldered or otherwise attached to the bottom DBC to form electrical connections to external devices.

Figure 2:
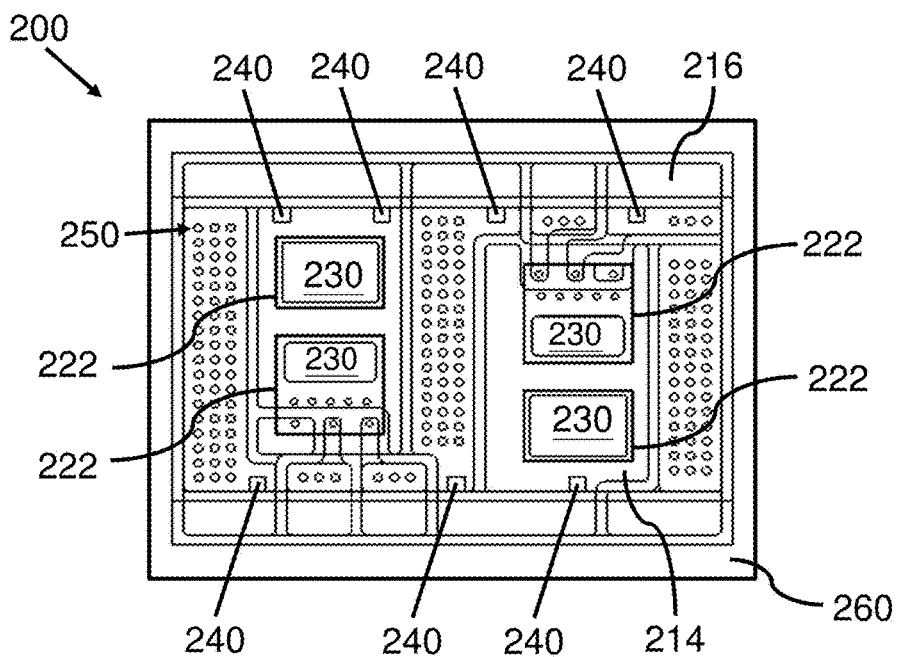
FIG. 2 shows a transparent view of a power electronic package in accordance with an example embodiment.

FIG. 2 shows a transparent view of a power electronic package or power electronic module 200. The power electronic package 200 includes a plurality of dies or chips 230 mounted on a solder block or solder base 222. The chips are positioned or arranged such that each of the chips is in electrical contact with a solder base. A plurality of spacers 240 are spaced around a perimeter of the power electronic package. As one example, the spacers are positioned adjacent the corners of the power electronic package. The spacers, for example, are formed of silicon and have a cross sectional shape of a circle or a polygon.

As shown in FIG. 2, the power electronic package 200 further includes a plurality of electrically non-conductive regions or passivation regions 214 and conductive regions 216. The conductive regions 216 define electrical connection paths for the chips 230 mounted on the solder bases 222 and define solderable areas.

As shown in FIG. 2, the power electronic package 200 further includes a plurality of solder blocks or solder balls 250 that contact the conductive region 216. In one example embodiment, a height of the solder balls is 60%-80% of the width of the solder balls.

As shown in FIG. 2, the power electronic package 200 also includes a molding compound or encapsulant 260 by a fully molding process or a transfer molding process. For example, a silicone gel or epoxy mold compound (EMC) is introduced into open cavities inside the package to provide a locking mechanism and improve the reliability of the package.

Figure 3:
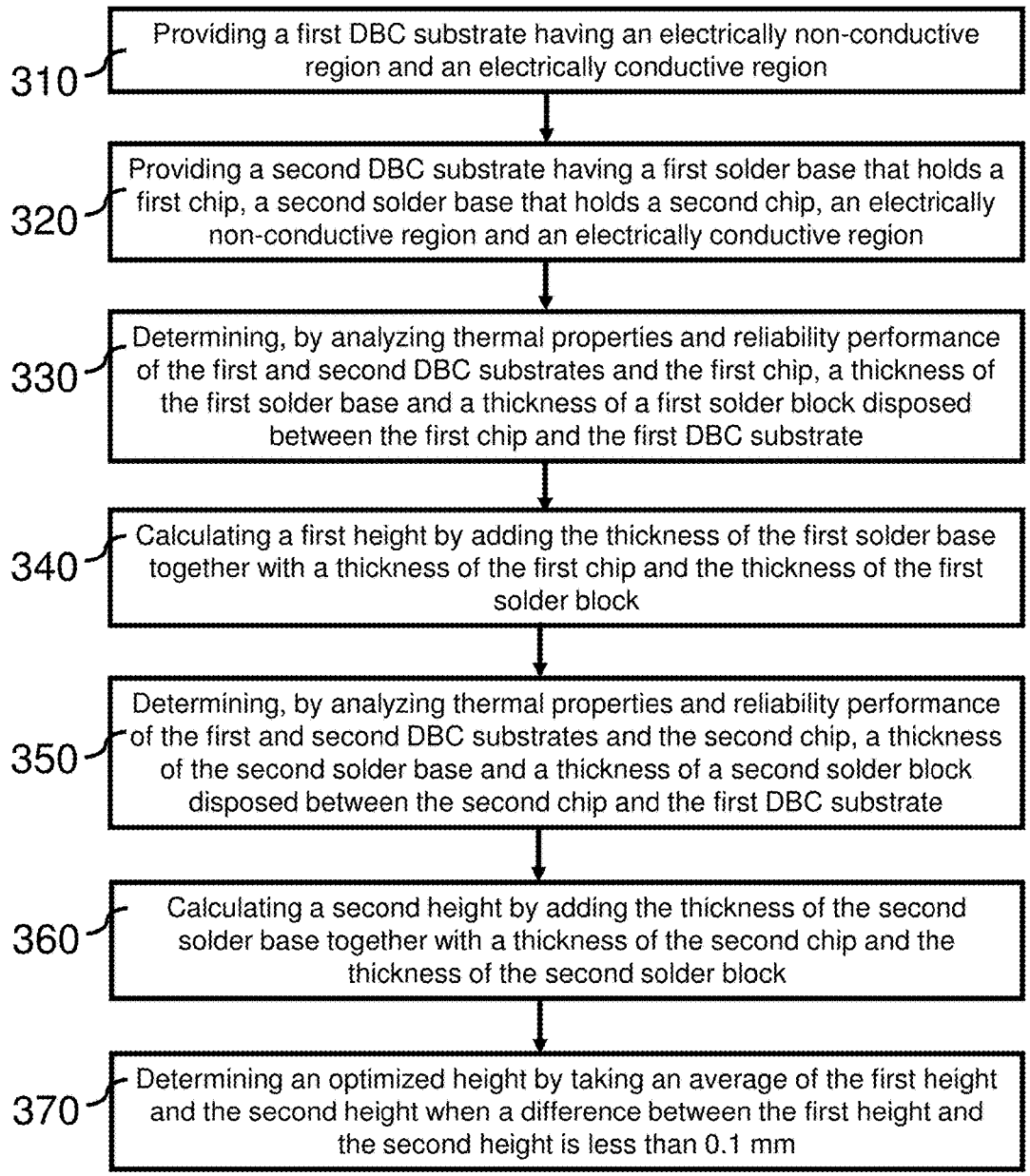
FIG. 3 shows a method of determining a thickness of a spacer in a power electronic package in accordance with an example embodiment.

FIG. 3 shows a method of determining a thickness of the spacers in accordance with an example embodiment.

According to block 310, a first DBC substrate having an electrically non-conductive region and an electrically conductive region are provided. As one example, the non-conductive region is defined through a passivation process to oxidize copper on the first DBC substrate along a predetermined path.

According to block 320, a second DBC substrate having a first solder base that holds a first chip, a second solder base that holds a second chip, an electrically non-conductive region and an electrically conductive region are provided. As one example, the size of the solder bases are predetermined and pre-formed by dicing or cutting a silicon wafer. The solder bases are attached to the second DBC substrate via solder pastes that are printed on the second DBC substrate. Thereafter, a plurality of chips are mounted on the solder bases.

According to block 330, a thickness of the first solder base and a thickness of a first solder block disposed between the first chip and the first DBC substrate are determined by analyzing thermal properties and reliability performance of the first and second DBC substrates and the first chip.

As one example, creep analysis and thermal analysis are performed to determine fatigue life of the solder blocks connected to the first and second DBC substrates and the first chip. Creep refers to the tendency of the solder to move or deform while under the influence of mechanical stresses.

As another example, thermal analysis and simulation are performed to determine the thermal resistance of the first and second DBC substrates and the first chip. Thermal analysis refers to the study of changes to properties of a material that is subjected to changes in temperature. In one example embodiment, numerical modeling and finite element simulations are performed to determine the thermal resistance between the junction of the first chip and the second substrate in consideration of different geometrical parameters and material properties. The thickness and shape of the second solder block can be justified according to the thermal design requirements.

In an example embodiment, a thicknesses of the first solder base is determined via software modeling and simulations according to design requirements for the power electronic package. As another example, a thickness of the first solder block disposed between the first chip and the first DBC substrate is determined based on the results of the creep analysis and the thermal analysis and on the type of the first solder block and its corresponding sitting opening. As one example, there are trade-offs between the fatigue life and thermal resistance. Therefore, a balance point is picked between these two parameters based on the criteria and the design requirements for the power electronic package.

According to block 340, a first height is calculated by adding the thickness of the first solder base together with a thickness of the first chip and the thickness of the first solder block.

According to block 350, a thickness of the second solder base and a thickness of a second solder block disposed between the second chip and the first DBC substrate are determined by analyzing thermal properties and reliability performance of the first and second DBC substrates and the second chip. As one example, creep analysis and thermal analysis are performed to determine fatigue life of the solder blocks connected to the first and second DBC substrates and the second chip. As another example, thermal analysis and simulation are performed to determine the thermal resistance of the first and second DBC substrates and the second chip. A thicknesses of the second solder base is then determined via software modeling and simulations according to design requirements. As another example, a thickness of the second solder block disposed between the second chip and the first DBC substrate is determined based on the results of the creep analysis and the thermal analysis and on the type of the second solder block and its corresponding sitting opening.

According to block 360, a second height is calculated by adding the thickness of the second solder base together with a thickness of the second chip and the thickness of the second solder block.

According to block 370, an optimized height is determined by taking an average of the first height and the second height when a difference between the first height and the second height is less than 0.1 mm. As one example, if the first height calculated by block 340 is 4 mm and the second height calculated by block 360 is 4.04 mm, the optimized height is determined to be 4.02 mm. As another example, if the first height calculated by block 340 is 4.0 mm and the second height calculated by block 360 is 4.2 mm, the process is sent back to block 330 to determine another first height and second height until the difference between the first height and the second height is less than 0.1 mm.

As an example embodiment, if the first height calculated by block 340 is 4 mm, the second height calculated by block 360 is 4.04 mm, and a third height, which is a sum of the thickness of a third chip, a third solder base that bonds the third chip to the second DBC substrate, and a third solder block that bonds the third chip to the first DBC substrate, is calculated to be 4.2 mm, then the process is looped back for the third chip to re-calculate the third height so that the final height difference among the first height, the second height and the third height is less than 0.1 mm. Otherwise, the power electronic assembly sustains too much mechanical force or stress, which may cause failure of the chips and other electronics housed in the assembly.

Figure 4:
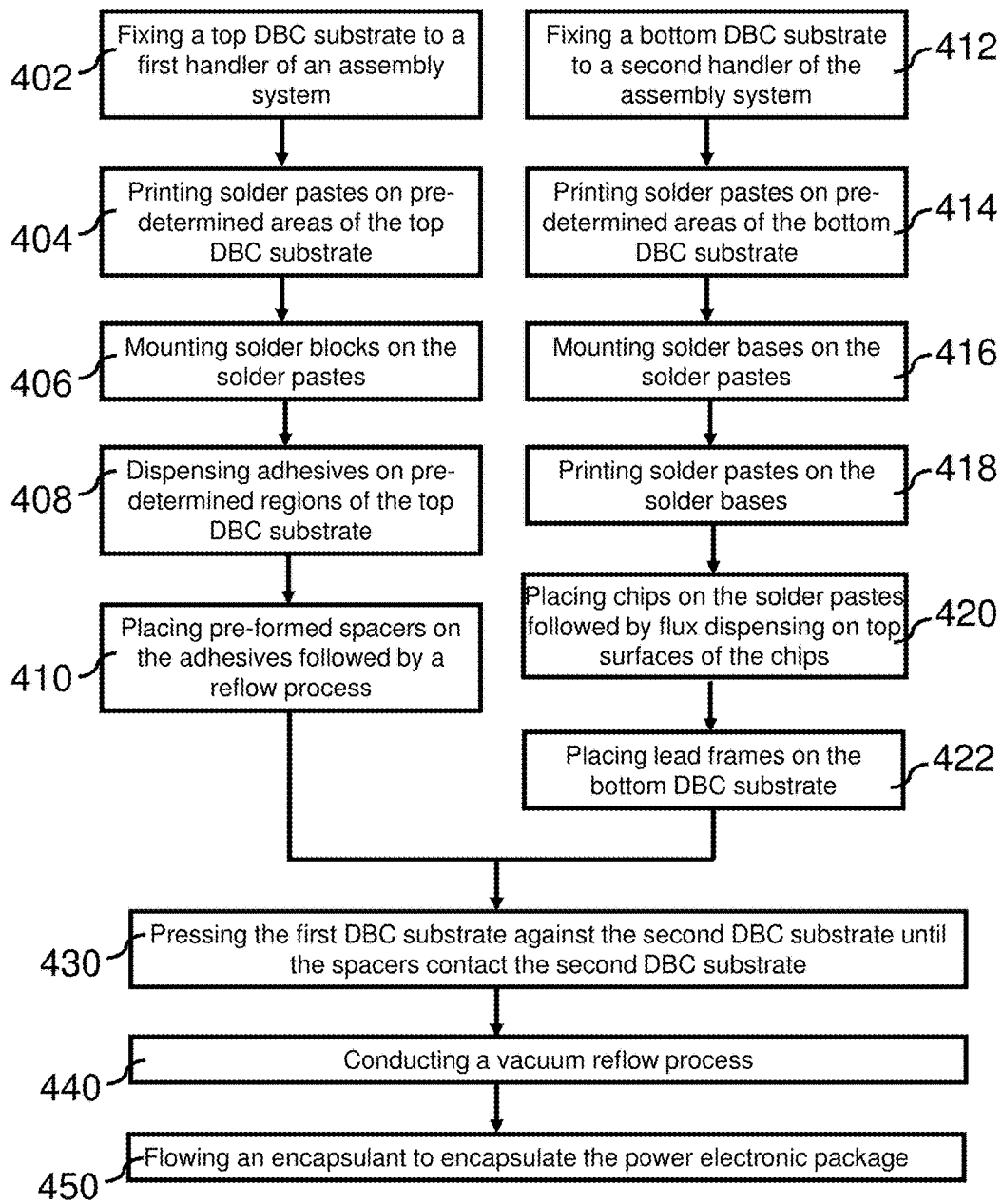
FIG. 4 shows a method to fabricate a power electronic package in accordance with an example embodiment.

FIG. 4 shows a process to fabricate a power electronic package in accordance with an example embodiment.

According to block 402, a top DBC substrate is fixed to a first handler of an assembly system. As one example, the assembly system has a plurality of handlers that can hold and fix substrates. As another example, the handlers also hold other components, such as chips and pre-formed spacers in proper alignment with respect to the substrates such that the components maintain a correct positional relationship during assembly and heating treatment.

According to block 404, solder pastes are printed on pre-determined areas of the top DBC substrate in order to attach solder blocks to the top DBC substrate.

According to block 406, solder blocks are mounted on the solder pastes by a handler of the assembly system.

According to block 408, adhesives are dispensed on pre-determined regions of the top DBC substrate in order to attach spacers to the top DBC substrate. For one example, the precise positioning and quantity of adhesives to be dispensed on the pre-determined regions are precisely controlled by a dispensing system.

According to block 410, pre-formed spacers are placed on the adhesives followed by a reflow process. For one example, at least three spacers that have a height equal to the optimized height that is determined by method as shown in FIG. 3 are attached to the adhesives. As another example, the reflow process is a heating process to melt the pastes or adhesives and form a mechanical connection and/or an electrical connection. The spacers, for example, are formed of silicon and have a cross sectional shape of a circle or a polygon.

According to block 412, a bottom DBC substrate is fixed to a second handler of the assembly system. As one example, the assembly system has a plurality of handlers that can hold and fix substrates. As another example, the handlers also hold other components, such as chips and pre-formed spacers in proper alignment with respect to the substrates such that the components maintain a correct positional relationship during assembly and heating treatment.

According to block 414, solder pastes are printed on pre-determined areas of the bottom DBC substrate in order to attach solder bases to the bottom DBC substrate.

According to block 416, solder bases are mounted on the solder pastes by a handler of the assembly system.

According to block 418, solder pastes are printed on the solder bases in order to attach chips to the bottom DBC substrate.

According to block 420, chips are placed on the solder pastes followed by a flux dispensing process on top surfaces of the chips to prepare the chips for connecting with the solder blocks on the top DBC substrate. By way of example, the flux dispensing process includes a chemical cleaning agent and a flowing agent to facilitate soldering by removing oxidation from the metals to be joined as well as sustaining the solid characteristic shapes of the solder blocks prior to being melted.

According to block 422, lead frames are placed on the bottom DBC substrate to form electrical connections to external devices.

According to block 430, the first DBC substrate is pressed against the second DBC substrate until the spacers contact the second DBC substrates. The chips that are mounted on the second DBC substrate also connect to the solder blocks on the first DBC substrate by this pressing step since the height of the spacers are precisely designed for such a connection. The height variation of the power electronic package is precisely controlled by the spacers to be less than 0.1 mm in order to reduce mechanical stress and the collapse rate of the solder blocks and chips introduced in the molding process.

According to block 440, a reflow process in conducted under vacuum environment to melt, for example, the solder blocks and form mechanical and/or electrical connections.

According to block 440, an encapsulant is flowed to encapsulate the power electronic package. For one example, fillers such as silicone gel or epoxy mold compound (EMC)

fill the open cavities inside the package to provide locking mechanism and improve the reliability of the package.

Figure 5:
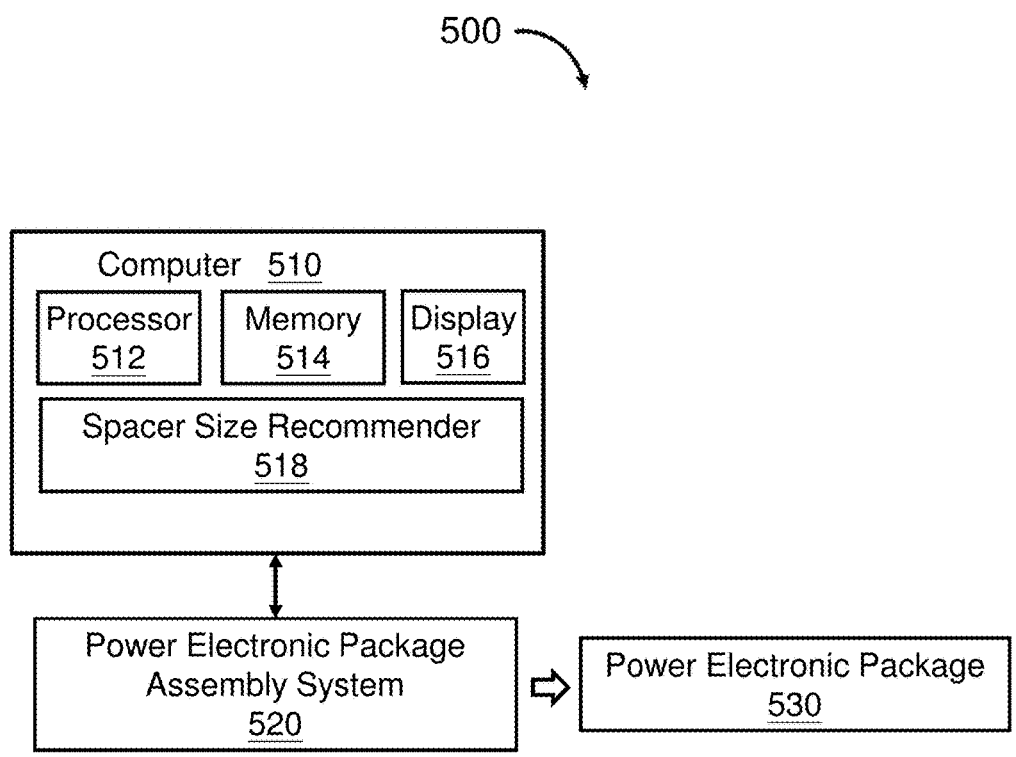
FIG. 5 shows a system that fabricates a power electronic package in accordance with an example embodiment.

FIG. 5 shows a system 500 that fabricates a power electronic package in accordance with an example embodiment. The system 500 includes a computer 510 and a power electronic package assembly system 520. The computer 510 includes a processor 512, a memory 514, a display 516 and a spacer size recommender 518. The processor 512 communicates with the memory 514 and the spacer size recommender 518, which provides a recommendation to the power electronic package assembly system 520 of a spacer size by analyzing thermal properties of the substrates and the chips. The space size recommender 518 includes software and/or hardware to execute one or more blocks discussed herein to determine a size for the spacers. The power electronic package assembly system 520 then fabricates a power electronic package 530 that includes a spacer with the recommended size.

Figure 6A:
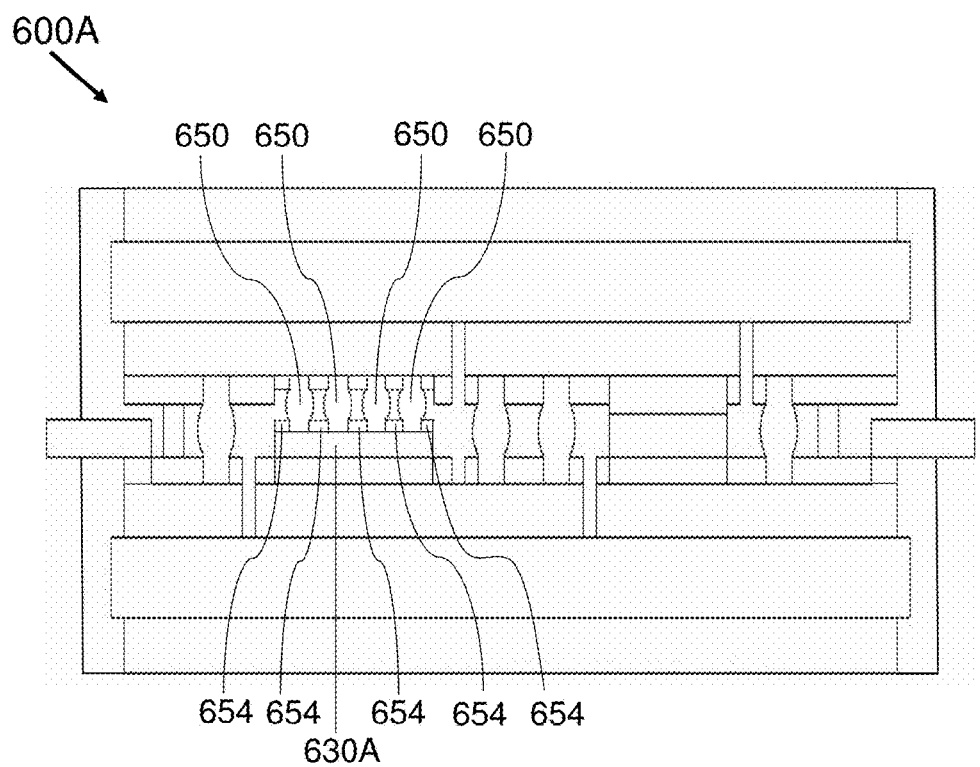
FIG. 6A shows a side view of a power electronic package in accordance with an example embodiment.

FIG. 6A shows a side view of a power electronic package 600A in accordance with an example embodiment. The power electronic package 600A is the same or similar as the power electronic package 100 disclosed in FIG. 1. As one difference, chip 630A is bonded to the top DBC substrate through solder balls 650. A plurality of passivation regions 654 are disposed on a top surface of the chip 630A and on an inner surface of the top DBC substrate that faces the chip. The distance between the neighbor passivation regions on the chip or on the inner surface of the top DBC substrate defines a sitting opening of each solder ball. As one example, the sitting opening of the solder balls is 80% of the diameter of the solder balls.

The solder balls contact the top DBC substrate and the chip 630A to electrically and mechanically connect the chip with the top DBC substrate. In one example embodiment, a height of the solder balls is 60%-80% of the width of the solder balls.

Figure 6B:
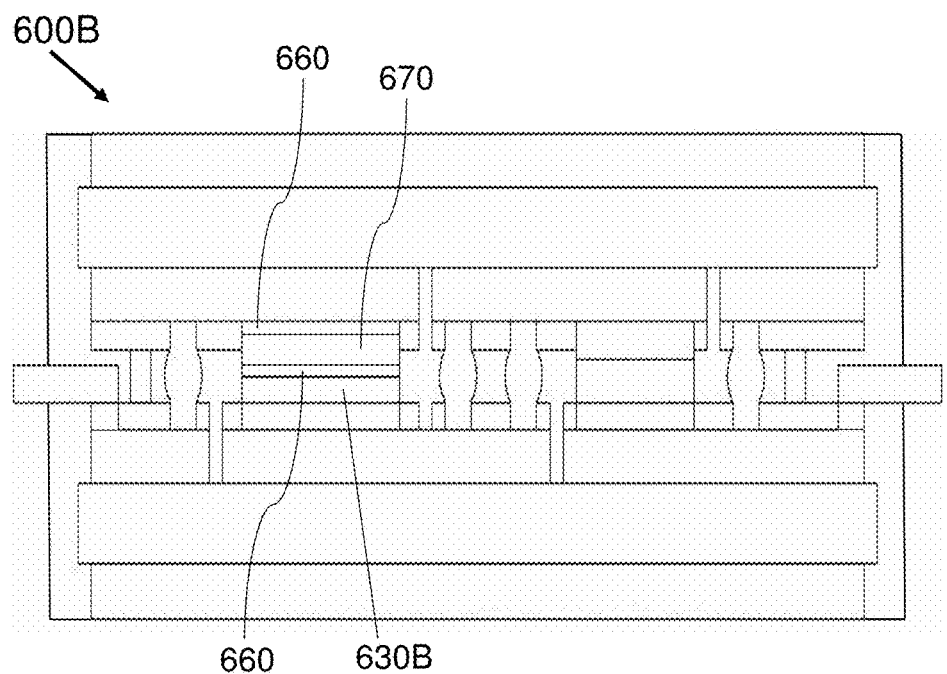
FIG. 6B shows a side view of a power electronic package in accordance with another example embodiment.

FIG. 6B shows a side view of a power electronic package 600B in accordance with another example embodiment. The power electronic package 600B is the same or similar as the power electronic package 100 disclosed in FIG. 1. As one difference, chip 630B is bonded to the top DBC substrate through a combination of solder and copper material. A copper layer 670 is sandwiched between two solder layers 660 such that the solder layer at the bottom is electrically and mechanically connected to the chip and the solder layer at the top is connected to the top DBC substrate.

The criteria used to evaluate a power module include parasitic inductance, parasitic resistance, and thermal impedance. Compared with a power module with wire-bonding, the parasitic inductance and parasitic resistance of the circuitry is reduced by up to 89%. Furthermore, since heat can be dissipated through both the top DBC substrate and the bottom DBC substrate, the junction-case thermal resistance is reduced by up to 54%.

Example embodiments relate to apparatus and methods that provide a power electronic package that includes a plurality of chips and electronic components housed in that dissipates heat and relieves mechanical stress from the chips.

An example embodiment includes a power electronic package or module with a top substrate and a bottom substrate oppositely disposed from the top substrate. The power electronic package serves to provide electrical interconnections, thermal dissipation, and mechanical support for a plurality of high power chips sandwiched between the top and bottom substrates. The power electronic package also houses analog and digital chips that function as a driver or a control circuit for the high power chips. The power electronic package also houses electronic components, such as a sensor that senses a temperature inside the package, or a sensor that detects current of different power chips or input voltage of digital chips inside the package.

The power electronic package includes spacers each having a first end that contacts a passivation region on the top substrate and a second end that contacts a passivation region on the bottom substrate. The spacers provide a mechanism to control a height of the power electronic package according to the specific power chips provided in each package. The height of the spacers is tailored or designed according to the height of the power chips, amount of solder being used, and other criteria discussed herein. The spacers divert the load away from the chips and reduce mechanical stress on electronic components in the power electronic package.

In one example embodiment, the power electronic package houses a plurality of low power chips that operate at a lower power than the power chips. The plurality of low power chips are mounted on the bottom substrate of the power electronic package through wire bonding, solder blocks or redistribution layer. The low power chips provide a driving power or a control signal for the power chips. By integrating both power chips and their driver within the same package, the gate loop parasitic inductance is reduced, which further reduces switching overshoot of the gate drive signal in the power electronic package by around 70%.

In one example embodiment, a height of the spacers is determined based on thermal properties of the substrates and the high power chips sandwiched in between such that heat generated by the high power chips is dissipated efficiently. A height variation of the power electronic package is precisely controlled by the spacers to be less than 0.1 mm in order to reduce mechanical stress on the chips and the solder blocks introduced in the moldering process and to reduce the collapse rate of the solder blocks.

Figure 7:
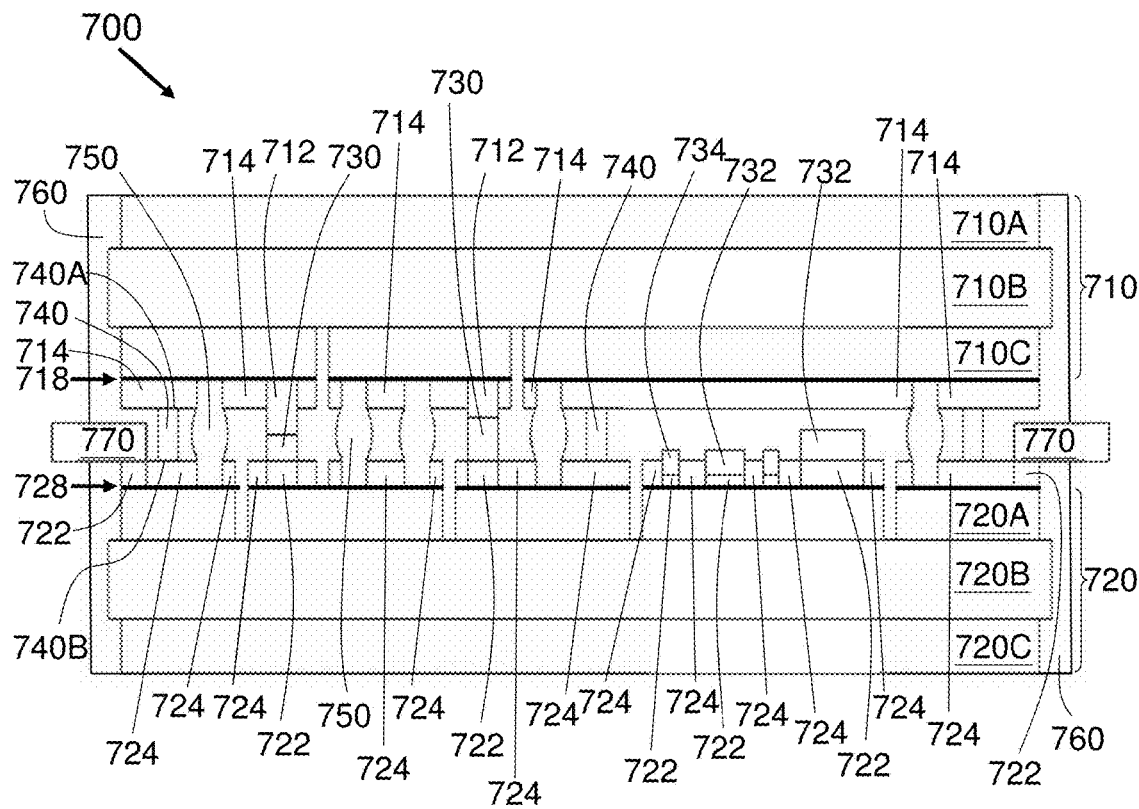
FIG. 7 shows a side view of a power electronic module in accordance with an example embodiment.

FIG. 7 shows a side view of a power electronic package or power electronic module 700. The power electronic package 700 includes a plurality of dies or chips 730, a plurality of dies or chips 732, and a plurality of electronic components 734, positioned or sandwiched between a top or first direct bonded copper (DBC) substrate 710 and a bottom or second DBC substrate 720.

As one example, the top DBC substrate comprises a ceramic base 710B and two copper layers 710A and 710C that are bonded onto top and bottom sides of the ceramic base 710B. The top DBC substrate 710 has an electrically conductive inner surface 718 that is disposed with a plurality of insulating blocks or passivation regions 714.

The bottom DBC substrate comprises a ceramic base 720B and two copper layers 720A and 720C that are bonded onto top and bottom sides of the ceramic base 720B. In one example embodiment, the two copper layers 720A and 720C electrically connect to each other. For example, a via opening extends through the ceramic base 720B and is filled with a conductive material to function as an interconnect between the two copper layers 720A and 720C.

The bottom DBC substrate 720 has an electrically conductive inner surface 728 that is disposed with a plurality of insulating blocks or passivation regions 724. The passivation regions are formed on the inner surfaces 718 and 728 of the DBC substrates by, for an example, oxidizing the copper surface. Oxidizing the copper surface defines electrical connection paths on the copper surface since the oxidized copper surface becomes not electrically conductive, leaving the non-oxidized copper surface to provide electrical connection paths. The non-oxidized copper surface is solderable such that the chips and other components can be soldered to the non-oxidized copper surface of the substrates.

A plurality of solder blocks or solder balls 712 are disposed between a top surface of the chips 730 and the electrically conducive inner surface 718 of the top DBC substrate 710. A plurality of solder blocks or solder bases 722 are disposed between a bottom surface of the chips 730 and the electrically conducive inner surface 728 of the bottom DBC substrate 720. In one example embodiment, a thickness of the solder bases 722 is determined by analyzing thermal properties and reliability performance of the power electronic package and the chips.

One or more spacers 740 are disposed between the top DBC substrate 710 and the second DBC substrate 720. The spacers are spaced around a perimeter of the power electronic package. Each spacer has a first end or terminal 740A and a second end of terminal 740B. The first end 740A contacts or abuts the passivation region 714 of the top DBC substrate 710, and the second end 740B contacts or abuts the passivation region 724 of the bottom DBC substrate 720.

As one example, the spacers are formed of silicon and have a cross sectional shape as one of a circle-shape and a polygon-shape. The spacers are positioned adjacent the corners of the power electronic package in order to divert the load away from the chips and solder blocks and reduce mechanical stress on electronic components in the power electronic package.

In an example embodiment, a height of the spacer 740 is equal to a height of the chip 730 plus a height of one of the first solder blocks 712 that connects the chip 730 to the first substrate, plus a height of one of the second solder blocks 722 that connects the chip 730 to the second substrate, and minus a total height of the first and second passivation regions that contact the spacer 740. The height variation of the power electronic package is precisely controlled to be less than 0.1 mm. The small variation of height reduces mechanical stress on the chips and the solder blocks introduced in the moldering process and reduce the collapse rate of the solder blocks.

As shown in FIG. 7, the power electronic package 700 further includes a third plurality of solder blocks or solder balls 750 that contact the electrically conductive inner surface 718 of the top DBC substrate 710 and contact the electrically conductive inner surface 728 of the bottom DBC substrate 720, in order to electrically connect the top DBC substrate with the bottom DBC substrate. In one example embodiment, a height of the solder balls is 60%-80% of the width of the solder balls.

The power electronic package 700 includes a molding compound or encapsulant 760 that fills the gaps between the top DBC substrate and the bottom DBC substrate by a fully molding process or a transfer molding process. For example, a silicone gel or epoxy mold compound (EMC) is introduced into open cavities inside the package to provide a locking mechanism and improve the reliability of the package. As one example, the outer surfaces of the substrates 710 and 720 or portions thereof are not covered by the molding compound in order to efficiently dissipate heat to ambient air.

As shown in FIG. 7, the power electronic package 700 includes lead frames 770 that are soldered or otherwise attached to the bottom DBC to form electrical connections to external devices.

By way of example, the power electronic package serves to provide electrical interconnections, thermal dissipation, and mechanical support for the chips 730 that operate at a high power. The power electronic package also houses other chips 732 that operate at a lower power and that function as a driver or a control circuit for the high power chips 730. The lower power chips 732 are mounted on the bottom substrate of the power electronic package through wire bonding, solder blocks or redistribution layer. The low power chips provide a driving power or a control signal for the high power chips. By integrating both high power chips and their driver chips within the same package, the gate loop parasitic inductance is reduced, which further reduces switching overshoot of the gate drive signal in the power electronic package.

In another example, a plurality of electronic components 734 are mounted on the bottom substrate to provide various functions. For example, the electronic components 734 include a temperature sensor that senses a temperature inside the package and feed the data to a driving circuit of the chips 730. For another example, the electronic components 734 include a sensor that detects current of different power chips or input voltage of digital chips inside the power electronic package 700. Detecting current of different power chips in the power electronic package prevents the current from exceeding the limit of power chips for protection purpose. For another example, the passive components 734 include resistors, capacitors and inductors that function as part of a driving circuit or other circuits inside the power electronic package.

Figure 8:
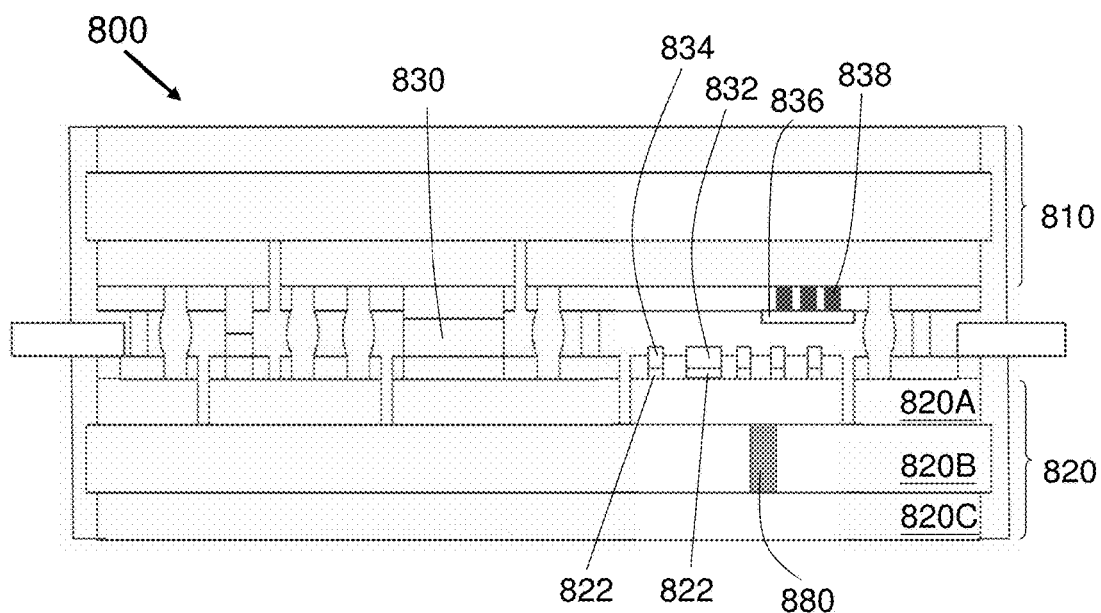
FIG. 8 shows a side view of a power electronic module in accordance with another example embodiment.

FIG. 8 shows a side view of a power electronic module 800 in accordance with another example embodiment. The power electronic module 800 is similar as the power electronic package 700 disclosed in FIG. 7. As one difference, a chip 836 is bonded to the top DBC substrate and electrically connected with the top DBC substrate through interconnects 838, for example, solder blocks, wire bonds or redistribution layers. The power electronic module 800 includes a plurality of dies or chips 830 and 832, and a plurality of electronic components 834 positioned or sandwiched between a top or first direct bonded copper (DBC) substrate 810 and a bottom or second DBC substrate 820. A top surface of chip 836 faces the chip 832 or the electronic components 834. The chips 830 and 832 and the electronic components 834 are electrically connected with the bottom DBC substrate through solder blocks 822.

The bottom DBC substrate includes a ceramic base 820B and two copper layers 820A and 820C that are bonded onto top and bottom sides of the ceramic base 820B. In one example embodiment, the two copper layers 820A and 820C electrically connect to each other. For example, a via or a via opening 880 extends through the ceramic base 820B to provide an electrical path. The via is filled with a conductive material to function as an electrical interconnect between the two copper layers 820A and 820C. For example, a diameter of the via from a top view of the via is 1 mm-2 mm. The electrical connection between copper layer 820A and copper layer 820C reduces the distributed capacitance among power chips to improve the electromagnetic interference (EMI) performance of the power electronics package.

Figure 9:
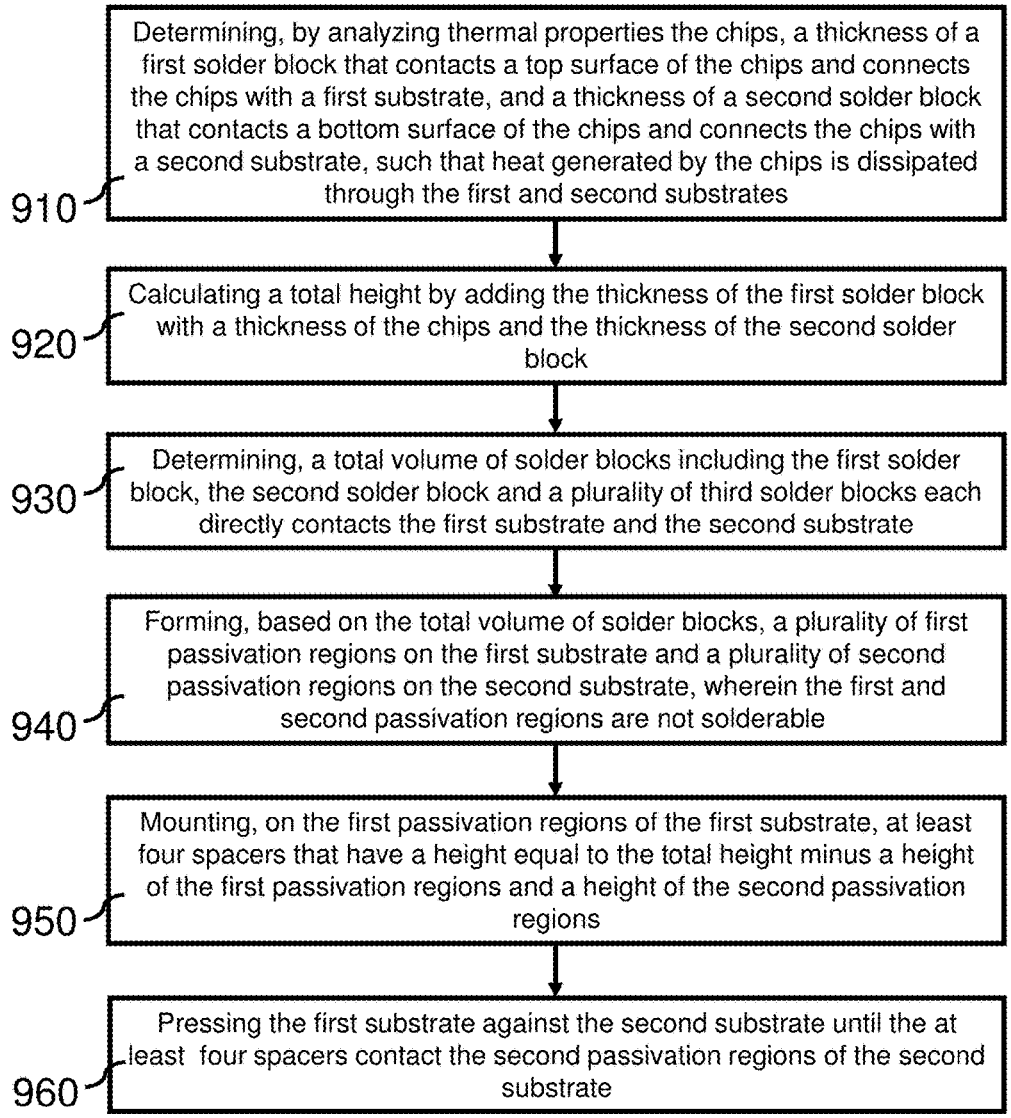
FIG. 9 shows a method to fabricate a power electronic module in accordance with an example embodiment.

FIG. 9 shows a method to fabricate a power electronic module in accordance with an example embodiment.

Block 910 states determining, by analyzing thermal properties the chips, a thickness of a first solder block that contacts a top surface of the chips and connects the chips with a first substrate, and a thickness of a second solder block that contacts a bottom surface of the chips and connects the chips with a second substrate, such that heat generated by the chips is dissipated through the first and second substrates.

Consider an example in which a power electronic module includes a first substrate and a second substrate that is oppositely disposed from the first substrate. A plurality of chips are electrically connected with the second substrate through a second solder block, and are electrically connected with the first substrate through a first solder block. Thicknesses of the first and second solder blocks are designed based on thermal properties the chips. For example, the thickness is based on the thermal conductivity of the chips such that heat generated by the chips is dissipated through the first and second solder blocks to the first and second substrates.

In one example embodiment, numerical modeling and finite element simulations are performed to determine the thermal resistance between the junction of the chip and the second substrate in consideration of different geometrical parameters and material properties. The thickness of the second solder block is then decided according to the thermal simulation results.

Block 920 states calculating a total height by adding the thickness of the first solder block with a thickness of the chips and the thickness of the second solder block.

As one example, if the first and second solder blocks are each 1 mm high, and the chip sandwiched in between is 2 mm high, then the total height is calculated to be 4 mm.

Block 930 states determining, a total volume of solder blocks including the first solder block, the second solder block and a plurality of third solder blocks each directly contacts the first substrate and the second substrate.

By way of example, solder blocks are distributed in the power electronic module to serve various functions such as providing electrical interconnects for chips and electronic components, contacting the first and bottom substrates in a specific region of the power electronic module, and providing a mechanical support for the chips and other components housed inside the power electronic module. A total volume of the solder blocks is determined to achieve the functions.

In one example embodiment, the total volume of the solder blocks is determined based on the thickness of the first and second solder blocks determined in block 910, and based on a dimension of the power electronic module.

Block 940 states forming, based on the total volume of solder blocks, a plurality of first passivation regions on the first substrate and a plurality of second passivation regions on the second substrate, wherein the first and second passivation regions are not solderable.

By way of example, the first and second passivation regions are formed on the first and second substrates by oxidizing the substrate surface or by deposition of oxide on the substrate. The non-oxidized surface provides electrical connection paths for the chips and other components that are mounted on the substrates. The first and second passivation regions are not solderable, which means solder block will not form on top of the first and second passivation regions.

Block 950 states mounting, on the first passivation regions of the first substrate, at least four spacers that have a height equal to the total height minus a height of the first passivation regions and a height of the second passivation regions.

By way of example, four spacers are pre-formed by dicing or cutting a silicon wafer. The spacers have a cross sectional shape of a circle or a polygon. The pre-formed spacers are mounted to the first passivation region on four corners of the first substrate through adhesives followed by a reflow process. The spacers have a height equal to the total height that is determined by block 920 minus a height of the first passivation regions and a height of the second passivation regions. As one example, if the total height is 4 mm and the height of the first and the second passivation regions is 0.5 mm each, then the height of the spacers is determined to be 3 mm.

In one example embodiment, a chip that operates at a low power is bonded to the top substrate and electrically connected with the top substrate through interconnects, for example, solder blocks, wire bonds or redistribution layers. The height of the chip is thinned down to a thickness such that the chip does not contact other chips or electronic components mounted on the second substrate.

Block 960 states pressing the first substrate against the second substrate until the at least four spacers contact the second passivation regions of the second substrate.

By way of example, the first substrate is pressed against the second substrate until the spacers contact the second passivation regions on the second substrate. Some of the chips, pre-mounted on the second substrate, contact the first solder blocks on the first substrate by this pressing step since the height of the spacers are precisely designed for such a connection. The height variation of the power electronic module is precisely controlled by the spacers to be less than 0.1 mm in order to reduce mechanical stress of the solder blocks and chips in the molding process.

In one example embodiment, after the first substrate is pressed against the second substrate to form the power electronic module, an encapsulant is flowed through or on the module to fill gaps between the first and second substrates and to electrically isolate the chips or electronic components from one another. For one example, fillers such as silicone gel or epoxy mold compound (EMC) fill the open cavities inside the package to provide locking mechanism and improve the reliability of the package.

In one example embodiment, before flowing the encapsulant that encapsulates the power electronic module, a plurality of holes are etched on an inner surface of the first and second substrates to expose a ceramic layer inside the first and second substrates. During the encapsulating process, the holes are filled with an encapsulant to improve reliability of the power electronic module.

Figure 10:
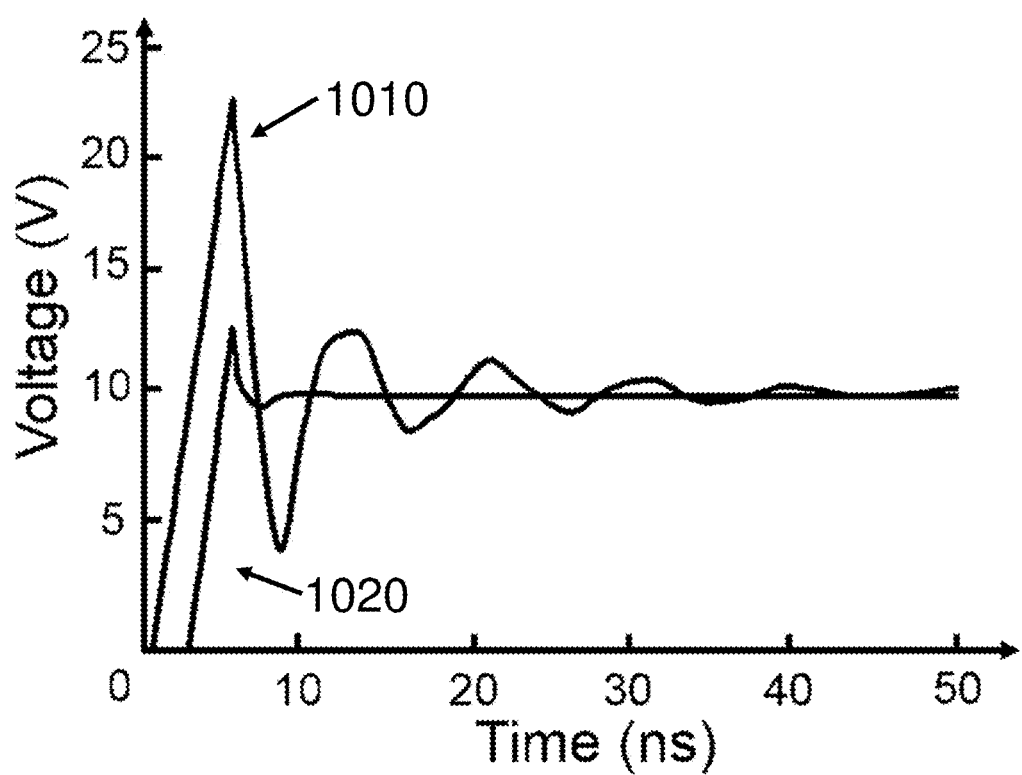
FIG. 10 shows a voltage overshoot of a power electronic module with an integrated driver circuit and a voltage overshoot of the power electronic module without an integrated driver circuit in accordance with an example embodiment.

FIG. 10 shows a voltage overshoot 1020 of a power electronic module with an integrated driver circuit and a voltage overshoot 1010 of the power electronic module without an integrated driver circuit in accordance with an example embodiment. The X-axis is time, and the Y-axis is voltage. The voltage overshoot 1010 for the power electronic module without an integrated driver circuit peaks at more than 20 V, which is more than 100% of the steady state voltage of 10V. The voltage overshoot 1020 for the power electronic module with an integrated driver circuit is reduced to around 30% of the steady state voltage value.

By way of example, the power electronic package houses high power chips and their driver circuits within the same package. The driver circuits provide a driving signal for the high power chips. By integrating both high power chips and their driver chips within the same package, the gate loop parasitic inductance is reduced, which further reduces overshoot of the gate drive signal in the power electronic package.

The methods and apparatus in accordance with example embodiments are provided as examples, and examples from one method or apparatus should not be construed to limit examples from another method or apparatus. Further, methods and apparatus discussed within different figures can be added to or exchanged with methods and apparatus in other figures. Further yet, specific numerical data values (such as specific quantities, numbers, categories, etc.) or other specific information should be interpreted as illustrative for discussing example embodiments.

As used herein, a "conductive region" is a region that is formed of a conductive material that allows the flow of electricity. Examples of a conductive material include, but are not limited to, solder alloys, copper, silver, gold, aluminum, zinc, nickel, brass, and other conductive material (such as other metals, graphite, polymers, and semiconductors).

As used herein, "fully molded power electronic module" is a power electronic assembly or module that is encapsulated by an encapsulant except for the exposed surfaces for heat dissipation.

As used herein, a "power electronic package" or a "power electronic module" is an electronic package or electronic module that contains power semiconductor devices. Examples of power semiconductor devices include, but are not limited to, MOSFET, diode, IGBT, bipolar junction transistor (BJT), thyristor, gate turn-off thyristor (GTO) and junction gate field-effect transistor (JFET).

As used herein, a "solder block" is a solder material having a ball shape, a cube shape, or another shape and includes metals and metal alloys.

As used herein, a "solder paste" is a material made up of a plurality of discrete particles of solder material suspended in a carrier such as a flux or other carrier agent to facilitate application to a substrate via a conventional stenciling or similar process.

As used herein, "solderable" means capable of being soldered with a solder block.

As used herein, "electronic components" are electronic devices that have a number of electrical terminals connected with one another to create an electronic circuit with a particular function. Examples of electronic components include, but are not limited to, diodes, transistors, resistors, capacitors, inductive devices, sensors and detectors.

What is claimed is:

1. A power electronic package, comprising:
   a first substrate having an electrically conductive inner surface disposed with a plurality of first insulating blocks;
   a second substrate oppositely disposed from the first substrate and having an electrically conductive inner surface disposed with a plurality of second insulating blocks;
   a plurality of first solder blocks disposed on the electrically conductive inner surface of the first substrate;
   a plurality of second solder blocks disposed on the electrically conductive inner surface of the second substrate;
   a plurality of first chips each having a top surface that contacts one of the first solder blocks and a bottom surface that contacts one of the second solder blocks;
   a second chip having a top surface that faces one of the first insulating blocks on the first substrate and a bottom surface that contacts one of the second solder blocks; and
   at least three spacers each having a top end that contacts one of the first insulating blocks on the first substrate, a bottom end that contacts one of the second insulating blocks on the second substrate, and a height that is based on a height of the first chips, on a height of the first solder blocks, on a height of the second solder blocks, on a height of the first insulating blocks, and on a height of the second insulating blocks such that a height of the power electronic package is controlled by varying the height of the spacers.

2. The power electronic package of claim 1, wherein the height of the spacers is an average of a first total height and a second total height,
   wherein the first total height equals a first height of a first one of the first chips plus a height of one of the first solder blocks that connects the first one of the first chips to the first substrate, plus a height of one of the second solder blocks that connects the first one of the first chips to the second substrate, and minus a total height of the first and second insulating blocks that contact the spacers, and
   wherein the second total height equals a second height of a second one of the first chips plus a height of one of the first solder blocks that connects the second one of the first chips to the first substrate, plus a height of one of the second solder blocks that connects the second one of the first chips to the second substrate, and minus the total height of the first and second insulating blocks that contact the spacers, and
   wherein a difference between the first total height and the second total height is in a range of 0.0 mm to 0.1 mm.

3. The power electronic package of claim 1, wherein the first solder blocks are solder balls with a height of 60% to 80% of a width of the solder balls.

4. The power electronic package of claim 1, wherein the height of the second solder blocks is determined by analyzing thermal properties and reliability performance of the power electronic package.

5. The power electronic package of claim 1 further comprising:
   a plurality of third solder blocks each contacts the electrically conductive inner surface of the first substrate and the electrically conductive inner surface of the second substrate.

6. The power electronic package of claim 1 further comprising:
   a molding compound that encapsulates the power electronic package including the first substrate, the second substrate, the first chips, and the second chip.

7. The power electronic package of claim 1, wherein the second substrate includes a ceramic layer sandwiched between two electrically conductive layers and the two electrically conductive layers electrically connect to each other through a conductive material that fills a via that extends through the ceramic layer.

8. The power electronic package of claim 1, wherein the spacers are formed of silicon and have a cross sectional shape as one of a circle-shape and a polygon-shape.

9. A fully molded power electronic module that includes a power chip and a second chip that operates at a lower power than the power chip, comprising:
   a first direct bonded copper (DBC) substrate;
   a second DBC substrate oppositely disposed from the first DBC substrate;
   a plurality of first solder blocks disposed on an inner surface of the first DBC substrate;
   a plurality of first electrically non-conductive blocks disposed on the inner surface of the first DBC substrate;
   a plurality of second solder blocks disposed on an inner surface of the second DBC substrate;
   a plurality of second electrically non-conductive blocks disposed on the inner surface of the second DBC substrate;
   a power chip having a top surface that contacts one of the first solder blocks and a bottom surface that contacts one of the second solder blocks;

a second chip having a top surface that faces one of the first electrically non-conductive blocks and a bottom surface that contacts one of the second solder blocks; and at least four spacers spaced around a perimeter of the fully molded power electronic package each having a first end that contacts one of the first electrically non-conductive blocks and a second end that contacts one of the second electrically non-conductive blocks.

10. The fully molded power electronic module of claim 9, wherein the first electrically non-conductive blocks are oxide materials formed on the inner surface of the first DBC substrate and the second electrically non-conductive blocks are oxide materials formed on the inner surface of the second DBC substrate.

11. The fully molded power electronic module of claim 9, wherein the inner surfaces of the first and second DBC substrates are etched with holes to expose a ceramic layer inside the first and second DBC substrates and the holes are filled with an encapsulant that encapsulates the fully molded power electronic package.

12. The fully molded power electronic module of claim 9 further comprising:
a third chip having a top surface that faces the second chip and a bottom surface that contacts one of the first solder blocks on the first DBC substrate.

13. The fully molded power electronic module of claim 9, wherein the second chip includes analog and digital chips that drive the power chip and sensors that detect a temperature, a current value or a voltage value of the fully molded power electronic module.

14. The fully molded power electronic module of claim 9, wherein the spacers are positioned adjacent four corners of the fully molded power electronic package to divert load from the power chip and the spacers have a total height that equals a height of the spacers plus heights of the first and second electrically non-conductive blocks that contact the spacers, wherein the total height is equal to a height of the power chip plus a height of the first solder blocks plus a height of the second solder blocks.

15. The fully molded power electronic module of claim 9, wherein the second chip is electrically connected with the first and second DBC substrates through wire bonds and redistribution layers.

16. A method of fabricating a power electronic module that encloses a plurality of chips with different heights, comprising:
determining, by analyzing thermal properties the chips, a thickness of a first solder block that contacts a top surface of the chips and connects the chips with a first substrate, and a thickness of a second solder block that contacts a bottom surface of the chips and connects the chips with a second substrate, such that heat generated by the chips is dissipated through the first and second substrates;

calculating a total height by adding the thickness of the first solder block with a thickness of the chips and the thickness of the second solder block;

determining, a total volume of solder blocks including the first solder block, the second solder block and a plurality of third solder blocks each directly contacts the first substrate and the second substrate;

forming, based on the total volume of solder blocks, a plurality of first passivation regions on the first substrate and a plurality of second passivation regions on the second substrate, wherein the first and second passivation regions are not solderable;

mounting, on the first passivation regions of the first substrate, at least four spacers that have a height equal to the total height minus a height of the first passivation regions and a height of the second passivation regions; and pressing the first substrate against the second substrate until the at least four spacers contact the second passivation regions of the second substrate.

17. The method of claim 16, wherein the at least four spacers are spaced around a perimeter of the fully molded power electronic module to reduce a mechanical stress of the fully molded power electronic module.

18. The method of claim 16 further comprising:
etching a plurality of holes on an inner surface of the first and second substrates to expose a ceramic layer inside the first and second substrates, wherein the holes are filled with an encapsulant to improve reliability of the fully molded power electronic module.

19. The method of claim 16, wherein the second substrate includes a ceramic layer sandwiched between two electrically conductive layers and the two electrically conductive layers electrically connect to each other through a conductive material that fills a via opening that extends through the ceramic layer.

20. The method of claim 16 further comprising:
flowing an encapsulant that fills gaps between the first substrate and the second substrate to electrically isolate the chips from one another.

* * * * *